United States Patent
Zhang et al.

(10) Patent No.: US 11,107,706 B2
(45) Date of Patent: Aug. 31, 2021

(54) GAS PHASE ETCHING DEVICE AND GAS PHASE ETCHING APPARATUS

(71) Applicant: BEIJING NAURA MICROELECTRONICS EQUIPMENT CO., LTD., Beijing (CN)

(72) Inventors: Jun Zhang, Beijing (CN); Zhenguo Ma, Beijing (CN); Xin Wu, Beijing (CN); Lihui Wen, Beijing (CN); Yunlong Hu, Beijing (CN); Henan Zhang, Beijing (CN); Fuping Chu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 178 days.

(21) Appl. No.: 16/372,659

(22) Filed: Apr. 2, 2019

(65) Prior Publication Data

US 2019/0228993 A1    Jul. 25, 2019

Related U.S. Application Data

(63) Continuation of application No. PCT/CN2017/105368, filed on Oct. 9, 2017.

(30) Foreign Application Priority Data

Oct. 8, 2016 (CN) .......................... 201610879076.5

(51) Int. Cl.
*H01L 21/67* (2006.01)
*H01L 21/311* (2006.01)

(52) U.S. Cl.
CPC .. *H01L 21/67069* (2013.01); *H01L 21/31116* (2013.01); *H01L 21/67103* (2013.01);
(Continued)

(58) Field of Classification Search
CPC ......... H01L 21/31116; H01L 21/67069; H01L 21/67103; H01L 21/67109; H01L 21/0206; H01L 21/67248; H01L 21/67115
See application file for complete search history.

(56) References Cited

U.S. PATENT DOCUMENTS

| 2002/0058422 | A1 | 5/2002 | Jang et al. | |
| 2002/0069968 | A1* | 6/2002 | Keller | C23C 16/455 156/345.33 |

(Continued)

FOREIGN PATENT DOCUMENTS

| CN | 1088272 A | 6/1994 |
| CN | 1750237 A | 3/2006 |

(Continued)

OTHER PUBLICATIONS

The World Intellectual Property Organization (WIPO) International Search Report and Written Opinion for PCT/CN2017/105368 dated Jan. 12, 2018 6 Pages.

*Primary Examiner* — Yuechuan Yu
(74) *Attorney, Agent, or Firm* — Anova Law Group, PLLC (57) ABSTRACT

Gas phase etching device and gas phase etching apparatus are provided. The gas phase etching device includes: a reaction chamber body, defining a space as a reaction chamber; a pedestal, disposed inside the reaction chamber for holding a workpiece; an inlet member, connected to the reaction chamber body for introducing etchants into the reaction chamber; a pressure regulating assembly, connected to the reaction chamber body for regulating a pressure inside the reaction chamber; a first temperature controller, con- (Continued)

nected to the reaction chamber body for controlling a temperature therein to a first temperature; and a second temperature controller, connected to the pedestal for controlling a temperature to a second temperature. The first temperature is a temperature that prevents the reaction chamber from being corroded by the etchants. The second temperature is a temperature under which the workpiece held by the pedestal satisfies a temperature requirement for directly performing a subsequent process.

9 Claims, 3 Drawing Sheets

(52) U.S. Cl.
CPC .. *H01L 21/67109* (2013.01); *H01L 21/67115* (2013.01); *H01L 21/67248* (2013.01)

(56) References Cited

U.S. PATENT DOCUMENTS

| | | | |
|---|---|---|---|
| 2009/0133835 A1* | 5/2009 | Nishimoto | C23C 16/46 156/345.27 |
| 2009/0191714 A1 | 7/2009 | Lai et al. | |
| 2010/0093151 A1 | 4/2010 | Arghavani et al. | |

FOREIGN PATENT DOCUMENTS

| | | | |
|---|---|---|---|
| CN | 101392374 A | | 3/2009 |
| CN | 101500935 A | | 8/2009 |
| CN | 102376604 A | | 3/2012 |
| CN | 102569136 A | | 7/2012 |
| CN | 104995723 A | | 10/2015 |
| JP | 05125541 A | * | 5/1993 |
| KR | 20050073679 A | | 7/2005 |
| TW | 200837828 A | | 9/2008 |
| TW | 201616577 A | | 5/2016 |

* cited by examiner

GAS PHASE ETCHING DEVICE AND GAS PHASE ETCHING APPARATUS

CROSS-REFERENCES TO RELATED APPLICATIONS

This application is a continuation application of International Application No. PCT/CN2017/105368, filed on Oct. 9, 2017, which claims priority to Chinese Patent Application No. 201610879076.5, filed on Oct. 8, 2016, the entire content of all of which is hereby incorporated by their reference.

FIELD OF THE DISCLOSURE

The present disclosure generally relates to the field of integrated circuit fabrication technology and, more particularly, relates to a gas phase etching device and a gas phase etching apparatus for removing silicon oxide in the integrated circuit fabrication process.

BACKGROUND

Figure 1:
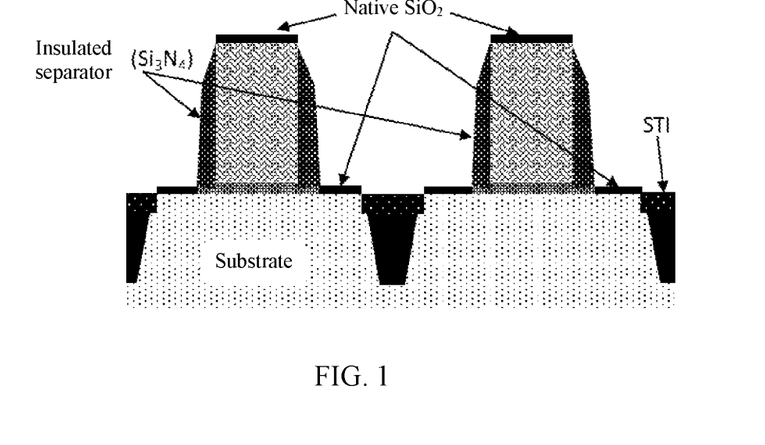
FIG. 1 illustrates a schematic diagram of an exemplary integrated circuit device having a native oxide layer.

In the integrated circuit fabrication process, silicon-based materials are often used. As shown in FIG. 1, when silicon (or polysilicon) is exposed to air, the silicon may naturally oxidize and a dense layer of silicon dioxide ($SiO_2$) may be formed on a surface of the silicon. In certain processes, a metal thin film may be in direct contact with a substrate of a silicon material. If a $SiO_2$ layer is present on a surface of the substrate, resistivity may increase, and performance of a fabricated device may decrease. Thus, prior to forming the metal thin film, the $SiO_2$ layer needs to be removed.

In the existing technology, a plasma etching process is often used to remove the $SiO_2$ layer. In the plasma etching process of removing the $SiO_2$, $NF_3$ and $NH_3$ are mixed to produce a plasma to etch the $SiO_2$. In the etching process, $NF_3$ and $NH_3$ react with the $SiO_2$ to produce $(NH_4)_2SiF_6$ in a chamber. $(NH_4)_2SiF_6$ is in solid state at room temperature. To discharge the solid state $(NH_4)_2SiF_6$ to the outside of the chamber, the substrate of the silicon-based material is heated to about 120° C. $(NH_4)_2SiF_6$ is sublimated into $SiF_4$, $H_2O$, and $NH_3$ to be discharged to the outside of the chamber. Thus, the plasma etching process of removing $SiO_2$ includes two steps of etching and annealing. After annealing, the substrate of the silicon-based material has a substantially high surface temperature and requires cooling. Therefore, the process is complicated. The two steps of etching and annealing are often performed in a same chamber or may be performed separately in different chambers. The existing equipment for the plasma etching process of removing $SiO_2$ is mainly divided into two types. In one type, a single chamber may be used in both the plasma etching process and the in-situ annealing process. That is, the two steps of etching and annealing are performed in the same chamber. Then, the substrate is cooled in a separate cooling chamber. The equipment may include the etching/annealing chamber and the cooling chamber. In another type, etching and annealing are performed separately. The two steps are performed in different chambers. Correspondingly, the equipment may include the etching chamber, the annealing chamber, and the cooling chamber.

Conventional device for removing $SiO_2$ requires multiple chambers, and is complicated in design, high in cost and low in productivity. Further, a by-product of the process is in solid state, which affects etching uniformity and reduces cleaning efficiency at bottoms of small holes. Thus, it is necessary to develop an etching device to effectively remove $SiO_2$.

The information disclosed in the background section of the specification is merely intended to provide an understanding of the general background of the present disclosure, and is not to be construed in any forms explicitly or implicitly as the existing technology known by those skilled in the art.

BRIEF SUMMARY OF THE DISCLOSURE

One aspect of the present disclosure provides a gas phase etching device, including: a reaction chamber body, defining a space as a reaction chamber; a pedestal, disposed inside the reaction chamber for holding a workpiece; an inlet member, connected to the reaction chamber body for introducing etchants into the reaction chamber; a pressure regulating assembly, connected to the reaction chamber body for regulating a pressure inside the reaction chamber; a first temperature controller, connected to the reaction chamber body for controlling a temperature inside the reaction chamber to a first temperature; and a second temperature controller, connected to the pedestal for controlling a temperature of the pedestal to a second temperature. The first temperature is a temperature that prevents the reaction chamber from being corroded by the etchants. The second temperature is a temperature under which the workpiece held by the pedestal satisfies a temperature requirement for directly performing a subsequent process.

Another aspect of the present disclosure provides a gas phase etching apparatus, including a gas phase etching device and a transfer device. The gas phase etching device and the transfer device are connected to allow a workpiece to be transferred between the gas phase etching device and the transfer device. The gas phase etching device includes a reaction chamber body, defining a space as a reaction chamber; a pedestal, disposed inside the reaction chamber for holding a workpiece; an inlet member, connected to the reaction chamber body for introducing etchants into the reaction chamber; a pressure regulating assembly, connected to the reaction chamber body for regulating a pressure inside the reaction chamber; a first temperature controller, connected to the reaction chamber body for controlling a temperature inside the reaction chamber to a first temperature; and a second temperature controller, connected to the pedestal for controlling a temperature of the pedestal to a second temperature. The first temperature is a temperature that prevents the reaction chamber from being corroded by the etchants. The second temperature is a temperature under which the workpiece held by the pedestal satisfies a temperature requirement for directly performing a subsequent process Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. Obviously, the drawings described below are merely some embodiments of the present disclosure. Other drawings may be derived from such drawings by a person with ordinary skill in the art without creative efforts and may be encompassed in the present disclosure. In the embodiments o the present disclosure, a same reference label often refers to a same part.

DETAILED DESCRIPTION

To make the foregoing objectives, features and advantages of the present disclosure clearer and more understandable, the present disclosure will be further described with reference to the accompanying drawings and embodiments. However, exemplary embodiments may be embodied in various forms and should not be construed as limited to the embodiments set forth herein. Rather, these embodiments are provided to fully convey the thorough and complete concepts of the exemplary embodiments to those skilled in the art.

Figure 2:
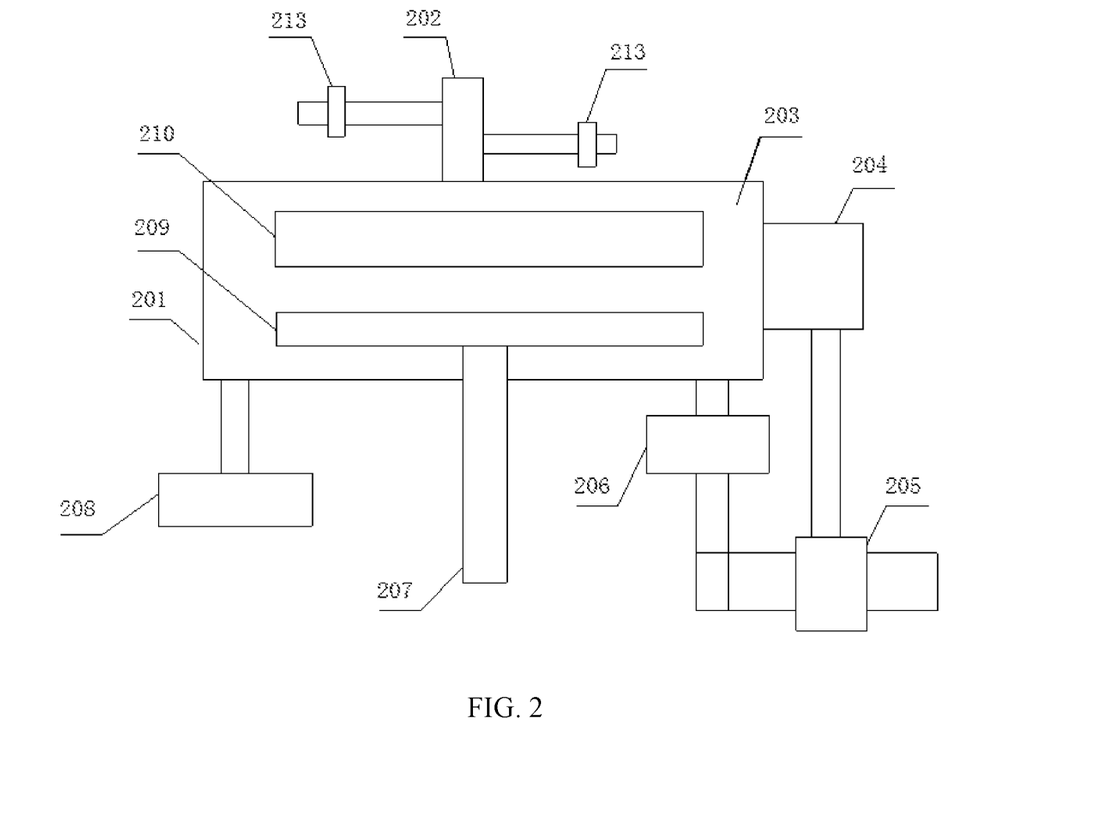
FIG. 2 illustrates a schematic of an exemplary gas phase etching device according to some embodiments of the present disclosure.

FIG. 2 illustrates a schematic of an exemplary gas phase etching device according to some embodiments of the present disclosure.

In one embodiment, the gas phase etching device may include a reaction chamber body 201, a pedestal 209, an inlet member 202, and a pressure regulating assembly. A space enclosed by the reaction chamber body 201 may form a reaction chamber 203. The pedestal 209 may be disposed at a bottom inside the reaction chamber 203 for holding a workpiece to be etched, such as a wafer. The inlet member 202 may be connected to the reaction chamber body 201. Gas etchant may enter the reaction chamber 203 through the inlet member 202. The pressure regulating assembly may be connected to the reaction chamber body 201 for regulating a pressure inside the reaction chamber 203. Further, the gas phase etching device may include a first temperature controller 208 and a second temperature controller 207. The first temperature controller 208 may be connected to the reaction chamber body 201 for controlling a temperature inside the reaction chamber 203 to a first temperature. At the first temperature, an inner wall of the reaction chamber 203 may not be corroded by the etchants. That is, the first temperature is a temperature under which the reaction chamber 203 may not be corroded. The second temperature controller 207 may be connected to the pedestal 209 for controlling a temperature of the pedestal 209 to a second temperature. At the second temperature, the workpiece held by the pedestal 209 may satisfy a temperature requirement for directly performing a subsequent step of the method according to the present disclosure. That is, the second temperature is a temperature under which the workpiece held by the pedestal 209 satisfies the temperature requirement for directly performing the subsequent step of the method according to the present disclosure. The first temperature controller 208 may regulate the temperature inside the reaction chamber 203 to the first temperature by controlling heat conduction, heat radiation, and/or heat convection of a gas medium, a liquid medium, or a solid medium. Similarly, the second temperature controller 207 may regulate the temperature of the pedestal 209 to the second temperature by controlling heat conduction, heat radiation, and/or heat convection of a gas medium, a liquid medium, or a solid medium.

In one embodiment, through controlling the temperature of the reaction chamber 203 and the temperature of the pedestal 209 holding the workpiece respectively, the subsequent step of the method according to the present disclosure may be performed on the workpiece without being cooled after the removal of the $SiO_2$. In this case, the gas phase etching device only needs to be disposed in an etching chamber without a need to integrating an annealing function into the etching chamber, a need for an additional annealing chamber, or a need for a separate cooling chamber. Thus, problems of requiring multiple chambers in the apparatus for removing the $SiO_2$, which complicates apparatus design, raises production cost and lowers production yield, may be resolved.

Exemplary structures of the gas phase etching device according to the present disclosure will be described in detail below.

As shown in FIG. 2, in one embodiment, in the gas phase etching device according to the present disclosure, the space defined by the reaction chamber body 201 may form the reaction chamber 203. The pedestal 209 for holding the workpiece may be disposed in a bottom region inside the reaction chamber 203. The inlet member 202 may be connected to the reaction chamber body 201. The inlet member 202 may include a plurality of inlet member pipes. Each inlet member pipe may be configured with a pneumatic valve 213. When the pneumatic valve 213 opens, gas etchants may be mixed in the inlet member 202 before entering the reaction chamber 203 through the inlet member 202.

Further, the gas phase etching device may also include the first temperature controller 208 and the second temperature controller 207. The first temperature controller 208 may be connected to the reaction chamber body 201 for regulating the temperature inside the reaction chamber 203 to the first temperature. At the first temperature, the inner wall of the reaction chamber 203 may not be corroded by the etchants. The second temperature controller 207 may be connected to the pedestal 209 for regulating the temperature of the pedestal 209 to the second temperature. At the second temperature, the workpiece held by the pedestal 209 may satisfy the temperature requirement for directly performing the subsequent step of the method according to the present disclosure. Preferably, the temperature regulating mechanism of the first temperature controller 208 may be specifically a heat exchanger, and the temperature regulating mechanism of the second temperature controller 207 may be specifically a water cooler. However, it should be understood by those skilled in the art that the present disclosure is not limited thereto, and any method of controlling and regulating the temperature inside the reaction chamber 203 and the temperature of the pedestal 209 may be utilized.

In one embodiment, the first temperature may be approximately between 50° C. and 90° C. The second temperature may be approximately between 20° C. and 60° C. Preferably, the first temperature may be about 70° C. and the second temperature may be about 40° C. In this case, a relatively high temperature of the reaction chamber 203 may help prevent the inner wall of the reaction chamber 203 from being corroded by the etchants. A relatively low temperature of the pedestal 209 may allow the etchants to react with the $SiO_2$ of the workpiece held by the pedestal 209 at the relatively low temperature, such that neither an annealing chamber nor a cooling chamber is needed. Thus, the cost is saved, the process route is shortened, and the production yield is increased.

In one embodiment, in the gas phase etching device according to the present disclosure, the pressure regulating assembly may be connected to the reaction chamber body 201 for regulating the pressure inside the reaction chamber 203.

In one embodiment, as shown in FIG. 2, the pressure regulating assembly may include a pressure regulator 206 for regulating the pressure inside the reaction chamber 203 to approximately between 30 Torr and 300 Torr, thereby increasing an etching selectivity of the gas phase etching. Preferably, the pressure inside the reaction chamber 203 may be about 200 Torr. In this case, through regulating the pressure inside the reaction chamber 203, the etchants may react under a high pressure, thereby increasing the etching selectivity and process efficiency.

In one embodiment, the pressure regulating assembly may also include a dry pump 205 and a molecular pump 204. The dry pump 205 may be used to regulate a humidity inside the reaction chamber 203. The molecular pump 204 may be used to extract by-products of the reaction from the reaction chamber 203 after the etching process is completed. The pressure regulator 206, the dry pump 205, and the molecular pump 204 together may form a vacuum system. During the etching process, the pressure regulator 206 may regulate the pressure inside the reaction chamber 203 and the dry pump 205 may regulate the humidity inside the reaction chamber 203. After the etching process is completed, the molecular pump 204 may generate a vacuum inside the reaction chamber 203 (e.g., extracting the by-products of the reaction) for preparing the workpiece for the subsequent process.

Figure 3:
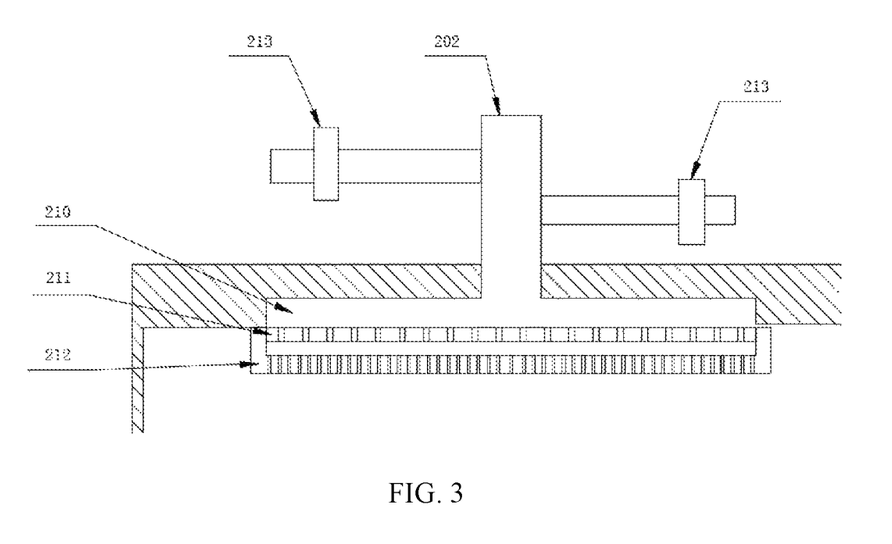
FIG. 3 illustrates a schematic of a showerhead of an exemplary gas phase etching device according to some embodiments of the present disclosure.

FIG. 3 illustrates a schematic view of a showerhead of an exemplary gas phase etching device according to some embodiments of the present disclosure.

In one embodiment, as shown in FIG. 2 and FIG. 3, the gas phase etching device may also include a showerhead 210. The showerhead 210 may be disposed in an upper region inside the reaction chamber 203 and may be connected to the inlet member 202. The showerhead 210 may be a 2-layer structure, including an upper flow-uniformization plate 211 and a lower flow-uniformization plate 212. From the inlet member 202, the etchants may enter the reaction chamber 203 passing through the upper flow-uniformization plate 211 and the lower flow-uniformization plate 212 of the showerhead 210. The upper flow-uniformization plate 211 may have a hole diameter greater than a hole diameter of the lower flow-uniformization plate 212.

For example, the gas etchants may first enter a space above the upper flow-uniformization plate 211. When flowing downward, the gas etchants may be blocked by the upper flow-uniformization plate 211 to change a flow direction. That is, the gas etchants may change the flow direction from a vertical downward direction to a horizontal direction. Thus, the upper flow-uniformization plate 211 may make the gas etchants flow more uniformly at a first attempt. That is, the gas etchants in a peripheral region of the upper flow-uniformization plate 211 and the gas etchants in a center region of the upper flow-uniformization plate 211 may reach a preliminary uniform state through a diffusively flowing in the horizontal direction. Then, the gas etchants may pass through the upper flow-uniformization plate 211 to enter a region above the lower flow-uniformization plate 212. After the gas etchants are blocked by the lower flow-uniformization plate 212, the gas etchants may continue to flow diffusively in the horizontal direction in the region above the lower flow-uniformization plate 212 to reach a more uniform state. Because the hole diameter of the upper flow-uniformization plate 211 is greater than the hole diameter of the lower flow-uniformization plate 212, the gas etchants may rapidly enter the showerhead 210 but discharge slowly out of the showerhead 210. The gas etchants may diffuse thoroughly in the showerhead 210 to reach a uniform state before passing through the lower flow-uniformization plate 212 under a relatively high pressure. Thus, the high-pressure requirement of the reaction chamber 203 is satisfied. The hole diameter of the lower flow-uniformization plate 212 may be smaller than about 1 mm. For example, the hole diameter of the lower flow-uniformization plate 212 may be about 0.5 mm.

Figure 4A:
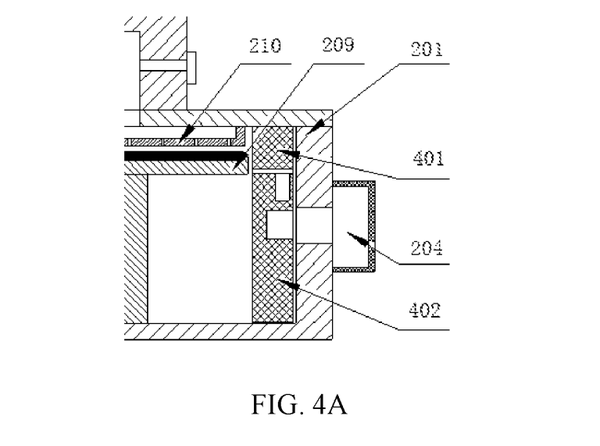
FIG. 4A and FIG. 4B illustrate schematic of a liner assembly of an exemplary gas phase etching device according to some embodiments of the present disclosure.
Figure 4B:
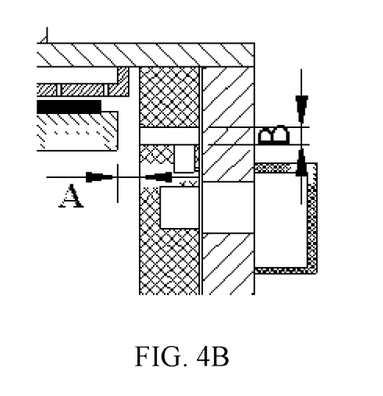

FIG. 4A and FIG. 4B illustrate schematic views of a liner assembly of an exemplary gas phase etching device according to some embodiments of the present disclosure.

In one embodiment, as shown in FIG. 4A and FIG. 4B, the gas phase etching device may also include a liner assembly. The liner assembly may be disposed inside the reaction chamber body 201 (i.e., inside the reaction chamber 203) and may cover sidewalls of the reaction chamber body 201. The liner assembly may include a first liner 401 and a second liner 402. The by-products of the reaction may pass through a gap A between the pedestal 209 and the first liner 401, a gap B between the first liner 401 and the second liner 402, and a gap between the second liner 402 and the reaction chamber body 201 to enter the molecular pump 204 of the pressure regulating assembly.

Liner structures inside the reaction chamber 203 may prevent the gas etchants from corroding the reaction chamber 203 to produce particles. As shown in FIG. 4A and FIG. 4B, the gas etchants may pass through the upper flow-uniformization plate 211 and the lower flow-uniformization plate 212, the gap A between the pedestal 209 and the first liner 401, the gap B between the first liner 401 and the second liner 402, and the gap between the second liner 402 and the sidewalls of the reaction chamber body 201 to enter the vacuum system (the pressure regulating assembly). Then, the gas etchants may be extracted by the molecular pump 204 that is connected to the reaction chamber body 201. To satisfy the high-pressure requirement, the gap A between the pedestal 209 and the first liner 401 may be designed to be smaller than 2 mm. The gap B between the first liner 401 and the second liner 402 may also be designed to be smaller than 2 mm, where A<B. For example, A=1.5 mm, B=2 mm, so that less gas etchants may enter the region under the pedestal 209 to ensure a desired utilization efficiency of the gas etchants.

In one embodiment, the inlet member 202 may introduce a dehydrated hydrogen fluoride gas and a dehydrated alcohol gas into the reaction chamber 203. The dehydrated hydrogen fluoride gas and the dehydrated alcohol gas may be mixed to produce gas etchants to remove the $SiO_2$ on the workpiece.

In one embodiment, the gas etchants may be produced by mixing a dehydrated HF gas and a methanol ($CH_3OH$) gas. Specifically, when the methanol ($CH_3OH$) gas is used, the chemical reaction formula for the gas phase etching device may be expressed as:

$$HF+CH_3OH \rightarrow HF_2^- + CH_3OH_2^+ \qquad (1)$$

$$HF_2^- + CH_3OH_2^+ + SiO_2 \rightarrow SiF_4 + CH_3OH + H_2O \qquad (2)$$

The dehydrated HF gas and the dehydrated $CH_3OH$ gas are mixed to produce the gas etchants $HF_2^-$ and $CH_3OH_2^+$. Then, the gas etchants $HF_2^-$ and $CH_3OH_2^+$ are mixed with $SiO_2$ to produce $SiF_4$, $CH_3OH$, and $H_2O$.

For example, during the process, the workpiece may be transferred from a transfer chamber to the reaction chamber 203. The second temperature controller 207 may regulate the temperature of the pedestal 209, such that a temperature of the workpiece may be regulated to approximately between 20° C. and 60° C. The first temperature controller 208 may regulate the temperature of the reaction chamber 203 and other structures to approximately between 50° C. and 90° C. After the temperature of the reaction chamber 203 and the temperature of the workpiece are stabilized, the pedestal 209 may be raised to an operation position. Then, the dehydrated HF gas and the dehydrated $CH_3OH$ gas are flowed in and mixed to produce the gas etchants $HF_2^-$ and $CH_3OH_2^+$. During the process, the pressure regulator 206 may regulate the pressure inside the reaction chamber 203 to approximately between 30 Torr and 300 Torr. Preferably, the pressure inside the reaction chamber 203 may be regulated to about 200 Torr, the temperature inside the reaction chamber 203 may be regulated to about 70° C., and the temperature of the pedestal may be regulated to about 40° C.

In one embodiment, a flow rate of the hydrogen fluoride gas may be approximately between 100 sccm and 500 sccm, and a flow rate of the alcohol gas may be approximately between 100 sccm and 1000 sccm. Preferably, the flow rate of the hydrogen fluoride gas may be approximately between 150 sccm and 225 sccm, and the flow rate of the alcohol gas may be approximately between 200 sccm and 450 sccm.

In one embodiment, a flow ratio of the hydrogen fluoride gas to the alcohol gas may be approximately 0.8~1.2:1. Preferably, the flow ratio of the hydrogen fluoride gas to the alcohol gas may be approximately 1:1.

In one embodiment, the alcohol gas may be at least one of C1-C8 monohydric alcohol gases. Preferably, the alcohol gas may be at least one of a methanol gas, an ethanol gas, or an isopropyl alcohol gas.

Figure 5:
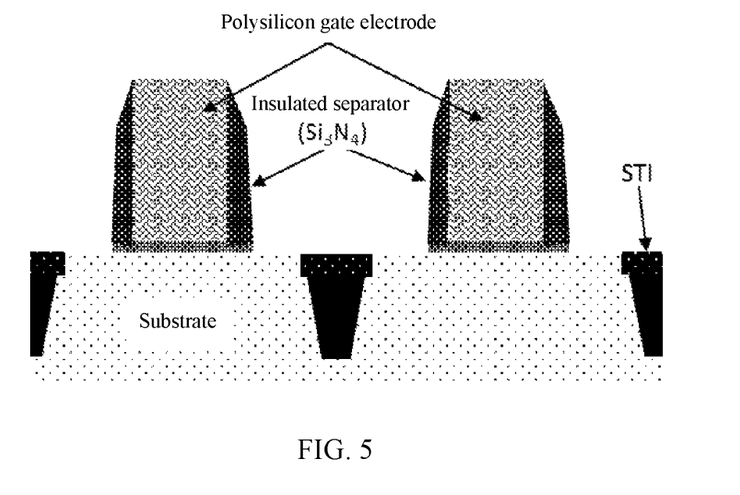
FIG. 5 illustrates a schematic of a device after removal of a native oxide layer according to some embodiments of the present disclosure.

FIG. 5 illustrates a schematic view of a device after a native oxide layer (e.g., naturally oxidized $SiO_2$ layer) is removed according to some embodiments of the present disclosure. Compared to the existing technology, when the gas phase etching device according to the present disclosure removes a naturally oxidized $SiO_2$ layer, the by-products of the reaction may not be in the solid state, and thus may be pumped out. As such, the process no longer needs the annealing process. The annealing process may be omitted. Moreover, because the by-products of the reaction are not in the solid state, the problem that the by-products in the solid state block small holes in the existing technology may be avoided. Thus, the removal of the $SiO_2$ layer at bottoms of small holes may be more effective, and the efficiency of removing the naturally oxidized $SiO_2$ layer may be improved. Further, because the reaction occurs at a low temperature (generally ≤40° C.), after the $SiO_2$ layer is removed, the workpiece no longer needs to be cooled and may be subject to a subsequent process directly. The gas phase etching device does not require the integration of the annealing function, a separate annealing chamber, or a separate cooling chamber. Thus, the structures are simplified, the process route is shortened, the production cost is saved, and the production yield is increased. The single chamber structure (only the etching chamber is required, and the annealing chamber and the cooling chamber are not required) makes it possible for integrating with subsequent processes. That is, other apparatuses required by the subsequent processes may be integrated together with the apparatus into a single pedestal. As such, the use of the apparatus is substantially flexible.

A water absorption feature of $CH_3OH$ may further reduce $HO_2$ residual on the surface of the workpiece. The relatively high pressure during the process may make it easier for the reaction gases to be absorbed by the surface of the workpiece and to react with the $SiO_2$ layer, thereby substantially increasing a removal rate and a removal uniformity of removing the $SiO_2$ layer on the surface of the workpiece.

The present disclosure also provides a gas phase etching apparatus. The gas phase etching apparatus may include a reaction apparatus and a transfer device. The reaction apparatus may be the gas phase etching device provided by the embodiments of the present disclosure. The transfer device may be connected to the reaction apparatus, such that a workpiece such as a wafer may be transferred between the transfer device and the reaction apparatus.

The gas phase etching device and the gas phase etching apparatus according to the present disclosure may provide the following advantages.

(1) In the gas phase etching device and the gas phase etching apparatus according to the present disclosure, the first temperature controller is configured inside the reaction chamber and the second temperature controller is configured on the pedestal to independently regulate the temperature of the reaction chamber and the temperature of the pedestal. The temperature inside the reaction chamber is regulated to the first temperature, which prevents the inner walls of the reaction chamber from being corroded. The temperature of the pedestal is regulated to the second temperature. The first temperature is greater than the second temperature. As such, after the etching process removes the oxidized layer such as the $SiO_2$ layer from the workpiece held by the pedestal, the temperature of the workpiece satisfies the temperature requirement for directly performing the subsequent process without being cooled. The integration of the annealing function into the etching chamber or the use of the separate annealing chamber are not required. Correspondingly, the separate cooling chamber is not required. The gas phase etching device and the gas phase etching apparatus only require the etching chamber. Thus, the structures are simplified, the process route is shortened, the production cost is saved, and the production yield is increased. The single chamber structure (only the etching chamber is required, and the annealing chamber and the cooling chamber are not required) makes it possible for integrating with subsequent processes. That is, other apparatuses required by the subsequent processes may be integrated together with the apparatus into a single pedestal. As such, the use of the apparatus is substantially flexible.

(2) The gas phase etching device and the gas phase etching apparatus according to the present disclosure use the gas phase etching process. That is, instead of the plasma etching process used in the existing technology, the gas phase etching process is used to remove the $SiO_2$ layer on the surface of the workpiece. Thus, when the gas phase etching device and the gas phase etching apparatus according to the present disclosure are used to remove the $SiO_2$ layer on the surface of the workpiece, no by-products of the reaction in the solid state are produced. The problem that the by-products of the reaction in the solid state block the small holes in the existing technology is avoided. Thus, the removal of the $SiO_2$ layer at the bottoms of the small holes may be more effective, and the efficiency of removing the naturally oxidized $SiO_2$ layer may be improved.

(3) Further, when the gas phase etching device and the gas phase etching apparatus according to the present disclosure remove the $SiO_2$ layer on the surface of the workpiece, the etching process is performed under the high pressure (e.g., the pressure inside the reaction chamber is approximately between 30 Torr and 300 Torr). As such, the etchants are more likely to be absorbed by the surface of the workpiece such as a silicon wafer to expedite the reaction rate and to increase the etching selectivity.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A gas phase etching device comprising:
   a reaction chamber body defining a space inside the reaction chamber body as a reaction chamber;
   a pedestal disposed inside the reaction chamber and configured for holding a workpiece;
   an inlet member connected to the reaction chamber body and configured for introducing etchants into the reaction chamber;
   a pressure regulating assembly connected to the reaction chamber body and configured for regulating a pressure inside the reaction chamber;
   a first temperature controller connected to the reaction chamber body and configured for controlling a temperature inside the reaction chamber to a first temperature, wherein the first temperature is a temperature that prevents the reaction chamber body from being corroded by the etchants;
   a second temperature controller connected to the pedestal and configured for controlling a temperature of the pedestal to a second temperature, wherein the second temperature is a temperature under which the workpiece held by the pedestal satisfies a temperature requirement for directly performing a subsequent process; and
   a liner assembly including a first liner and a second liner, wherein:
      the first liner and the second liner are configured to stack in a vertical relationship to form a first gap between the first liner and the pedestal and a second gap between the first liner and the second liner, and the first liner and the second liner cover and shield sidewalls of the reaction chamber body;
      a position of the second gap corresponds to a position of the pedestal; and
      a reaction by-product passes through the first gap, the second gap, and a third gap between the second liner and the reaction chamber body to be extracted out of the reaction chamber.

2. The gas phase etching device according to claim 1, wherein:
   the first temperature controller is configured for regulating a temperature inside the reaction chamber to the first temperature by heat conduction, heat radiation, and/or heat convection of a gas medium, a liquid medium, or a solid medium; and/or
   the second temperature controller is configured for regulating a temperature of the pedestal to the second temperature by heat conduction, heat radiation, and/or heat convection of a gas medium, a liquid medium, or a solid medium.

3. The gas phase etching device according to claim 2, wherein:
   the first temperature is approximately between 50° C. and 90° C.

4. The gas phase etching device according to claim 2, wherein:
   the second temperature is approximately between 20° C. and 60° C.

5. The gas phase etching device according to claim 1, wherein:
   the pressure regulating assembly includes a pressure regulator configured for regulating a pressure inside the reaction chamber to be approximately between 30 Torr and 300 Torr to increase an etching selectivity.

6. The gas phase etching device according to claim 1, further including a showerhead, wherein;
   the showerhead is disposed in an upper region of the reaction chamber and is connected to the inlet member;
   the showerhead includes an upper flow-uniformization plate and a lower flow-uniformization plate;
   the etchants enter the reaction chamber by passing through the upper flow-uniformization plate and the lower flow-uniformization plate of the showerhead; and
   a hole diameter of the upper flow-uniformization plate is greater than a hole diameter of the lower flow-uniformization plate.

7. The gas phase etching device according to claim 1, wherein;
   the first gap between the pedestal and the first liner is smaller than the second gap between the first liner and the second liner.

8. The gas phase etching device according to claim 1, wherein;
   the inlet member is used to introduce a dehydrated hydrogen fluoride gas and a dehydrated alcohol gas into the reaction chamber; and
   the dehydrated hydrogen fluoride gas and the dehydrated alcohol gas are mixed to remove $SiO_2$ on a surface of the workpiece.

9. A gas phase etching apparatus, comprising:
   a gas phase etching device; and
   a transfer device,
   wherein:
      the gas phase etching device and the transfer device are connected to allow a workpiece to be transferred between the gas phase etching device and the transfer device; and
      the gas phase etching device includes:
         a reaction chamber body defining a space inside the reaction chamber body as a reaction chamber;
         a pedestal disposed inside the reaction chamber and configured for holding the workpiece;
         an inlet member connected to the reaction chamber body and configured for introducing etchants into the reaction chamber;
         a pressure regulating assembly connected to the reaction chamber body and configured for regulating a pressure inside the reaction chamber;
         a first temperature controller connected to the reaction chamber body and configured for controlling a temperature inside the reaction chamber to a first temperature, wherein the first temperature is a temperature that prevents the reaction chamber body from being corroded by the etchants;

a second temperature controller connected to the pedestal and configured for controlling a temperature of the pedestal to a second temperature, wherein the second temperature is a temperature under which the workpiece held by the pedestal satisfies a temperature requirement for directly performing a subsequent process; and a liner assembly including a first liner and a second liner, wherein:
- the first liner and the second liner are configured to stack in a vertical relationship to form a first gap between the first liner and the pedestal and a second gap between the first liner and the second liner, and the first liner and the second liner cover and shield sidewalls of the reaction chamber body;
- a position of the second gap corresponds to a position of the pedestal; and
- a reaction by-product passes through the first gap, the second gap, and a third gap between the second liner and the reaction chamber body to be extracted out of the reaction chamber.

* * * * *